(12) United States Patent
Aoki et al.

(10) Patent No.: US 6,807,082 B2
(45) Date of Patent: Oct. 19, 2004

(54) SEMICONDUCTOR DEVICE AND METHOD OF MANUFACTURING THE SAME

(75) Inventors: Masaki Aoki, Kawasaki (JP); Keizo Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 10/282,013

(22) Filed: Oct. 29, 2002

(65) Prior Publication Data

US 2003/0173604 A1 Sep. 18, 2003

(30) Foreign Application Priority Data

Mar. 18, 2002 (JP) ........................................ 2002-074731

(51) Int. Cl.[7] ............................................. G11C 11/22
(52) U.S. Cl. ..................................... 365/145; 365/149
(58) Field of Search ................................ 365/145, 149

(56) References Cited

U.S. PATENT DOCUMENTS 6,301,145 B1 * 10/2001 Nishihara .................... 365/145
6,396,730 B1 * 5/2002 Lin et al. ..................... 365/145
6,404,667 B1 * 6/2002 Yoo ........................... 365/145

* cited by examiner

*Primary Examiner*—Van Thu Nguyen
*Assistant Examiner*—Pho M. Luu
(74) *Attorney, Agent, or Firm*—Westerman, Hattori, Daniels & Adrian LLP

(57) ABSTRACT

A stacked FeRAM uses a structure where the bit line is formed above the ferroelectric capacitor. The word line is formed so that it moves away from the opposing other word line in areas near the contact plug with the relevant contact plug in between, and moves toward the other word line in areas not near the contact plug, and the contact hole is formed so that it is displaced alternately with respect to the longitudinal centerline of the relevant plate line.

8 Claims, 12 Drawing Sheets

SEMICONDUCTOR DEVICE AND METHOD OF MANUFACTURING THE SAME

BACKGROUND OF THE INVENTION

This application claims the benefit of a Japanese Patent Application No. 2002-074731 filed Mar. 18, 2002 in the Japanese Patent Office, the disclosure of which is hereby incorporated by reference.

1. Field of the Invention

The present invention relates to semiconductor devices, and more particularly to a semiconductor device used as a ferroelectric memory.

2. Description of the Related Art

Ferroelectric memory (FeRAM: Ferroelectric Random Access Memory) is known as a nonvolatile memory capable of storing information even when the power is turned OFF. Many conventional ferroelectric memories have a planar-type structure formed on an insulating film covering the memory cell transistor. Ferroelectric memory is characterized in that it is a voltage driven element, has low power consumption, and operates at a very high speed compared to flash memory or EEPROM.

Moreover, the ferroelectric memory presented in an academic conference has a COB (Capacitor Over Bit line) structure used in a DRAM (Dynamic Random Access Memory). This COB structure is a structure in which the ferroelectric capacitor is formed above the bit line pattern after the bit line pattern is formed. In the COB structure, since the bit line pattern is formed before the memory cell capacitor is formed, the bit line pattern can be formed on a flat plane; and this structure can be widely used in DRAMs where it is necessary to increase the surface area using a memory cell capacitor of complex shape.

In the FeRAM market, many applications for system LSI such as smart card and the like can be found. Therefore, using the CMOS process as the forming step, there is a need to decrease the size for additional memory cells and achieve high integration density.

Furthermore, although the COB structure is, as mentioned above, a suitable structure for DRAM in that the bit line pattern can be formed on a flat plane even if the size of the ferroelectric capacitor is increased, the bit lines are formed before the ferroelectric capacitor in a manufacturing step. Thus, when the COB structure is used for FeRAM, there is a need to prevent oxidation or melting of bit line patterns during heat treatment in an oxidation atmosphere for crystallization or for oxygen loss compensation of the ferroelectric film. For example, Al pattern melts when the processing temperature exceeds 500° C. In a polycrystalline silicon pattern, oxidation may occur due to heat treatment in an oxidation atmosphere.

SUMMARY OF THE INVENTION

Accordingly, it is a general object of the present invention to provide a semiconductor device that achieves high integration density and is easy to manufacture.

The present invention achieves the above object by providing a semiconductor device having a substrate; a plurality of memory cell transistors formed on the substrate and arranged in arrays in a first direction and in a second direction different from the first direction, each of the memory cell transistor being provided with a first and a second diffusion legion; a ferroelectric capacitor connected to the first diffusion region in each of the plurality of memory cell transistors via a first contact plug; a plurality of bit lines formed above the ferroelectric capacitor, and connected to the second diffusion regions of the memory cell transistors arranged in the first direction via a second contact plug, each bit line being extended in the first direction and arranged next to each other in the second direction; a plurality of word lines formed between the first and second contact plugs of each memory cell transistors, each word line being extended in the second direction and arranged next to each other in the first direction; and a plurality of plate lines each being extended in the second direction and arranged next to each other in the first direction, the plate lines being connected to upper electrodes of a group of the ferroelectric capacitors arranged in the second direction through a plurality of contact holes; wherein each of the word lines is bent away from an opposing other word line in areas near the second contact plugs, and toward the other word line in other areas; and the plurality of contact holes is displaced alternately with respect to a longitudinal centerline of the plate line.

In this way, by forming the word line so that it is bent away from the opposing other word line in areas near the second contact plug, and toward the other word line in other areas, and by forming the contact hole for connecting the plate line and the upper electrode of the ferroelectric capacitor, displaced alternately with respect to the longitudinal center line of the plate line, the size of the memory cell is reduced and higher integration density can be achieved compared to forming the word line linearly and bending it away from the other word lines even in areas not near the second contact plugs and forming the contact hole on the centerline of the plate line.

Furthermore, compared to DRAM, in FeRAM, there is no need to increase the size or the surface area of the ferroelectric capacitor and its capacitance, and thus the ferroelectric capacitor is relatively simple and has a low height structure. Here, even if CUB (Capacitor Under Bit Line) structure for forming the bit line above the ferroelectric capacitor in FeRAM is used, the formation of the bit line will not be complicated. Moreover, because the bit line is formed after the ferroelectric capacitance, the bit line will not oxidize or melt during heat treatment for suppressing oxygen loss of the ferroelectric film. Therefore, manufacturing is facilitated.

The present invention further achieves the above object by providing a semiconductor device having a substrate; a plurality of memory cell transistors formed on the substrate and forming arrays; a ferroelectric capacitor connected to a first diffusion region of the memory cell transistor in each of the memory cell transistors; and a plurality of bit lines formed above the ferroelectric capacitor, and each bit line being connected commonly to a second diffusion region of a group of the memory cell transistors.

The present invention further achieves the above object by providing a semiconductor device having a substrate; a memory cell transistor formed on the substrate and provided with a first and a second diffusion region; a ferroelectric capacitor connected to the first diffusion region in the memory cell transistor via a first contact plug; a bit line formed above the ferroelectric capacitor, and connected to the second diffusion region via a second contact plug; a word line formed between the first and the second contact plug; and a plurality of plate lines connected to upper electrodes of the ferroelectric capacitors through contact holes; wherein the plate line comprises projecting portions on one side of its extending direction; and the contact hole being formed on the projecting portions.

The present invention further achieves the above object by providing a semiconductor device having a substrate; a memory cell transistor array formed on the substrate; a ferroelectric capacitor provided in each of the memory cell transistors; a word line being extended as a gate electrode in a group of the memory cell transistor arranged in a first direction; a plate line being extended in the first direction and connected to the group of the memory cell transistors arranged in the first direction through each of a plurality of contact holes; and a bit line being extended in a second direction and connected to a group of the ferroelectric capacitors arranged in the second direction via each of a plurality of contact plugs; wherein the word line is bent with respect to the first direction so as to move away from an opposing other word line in areas near the contact plug, and move toward the other word line in other areas; the plate line having a plurality of projecting portions displaced alternately with respect to the first direction; the projecting portion projecting in a bent direction of the word line; each of the contact hole being formed on the projecting portion.

The present invention further achieves the above object by providing a method of manufacturing a semiconductor device having the steps of forming a memory cell transistor on a substrate; performing heat treatment on a ferroelectric film of a ferroelectric capacitor; forming a contact plug connected to the memory cell transistor after the step of performing heat treatment; forming a bit line connected to the memory cell transistor via the contact plug somewhere above the ferroelectric capacitor; forming a word line adjacent to the contact plug so as to be bent away from an opposing other word line in areas near the contact plug, and toward the other word line in other areas; forming a plate line; and forming a contact hole for connecting an upper electrode of the ferroelectric capacitor and the plate line at a position deviating from a longitudinal centerline of the plate line.

DESCRIPTION OF THE PREFERRED EMBODIMENTS

Figure 1:
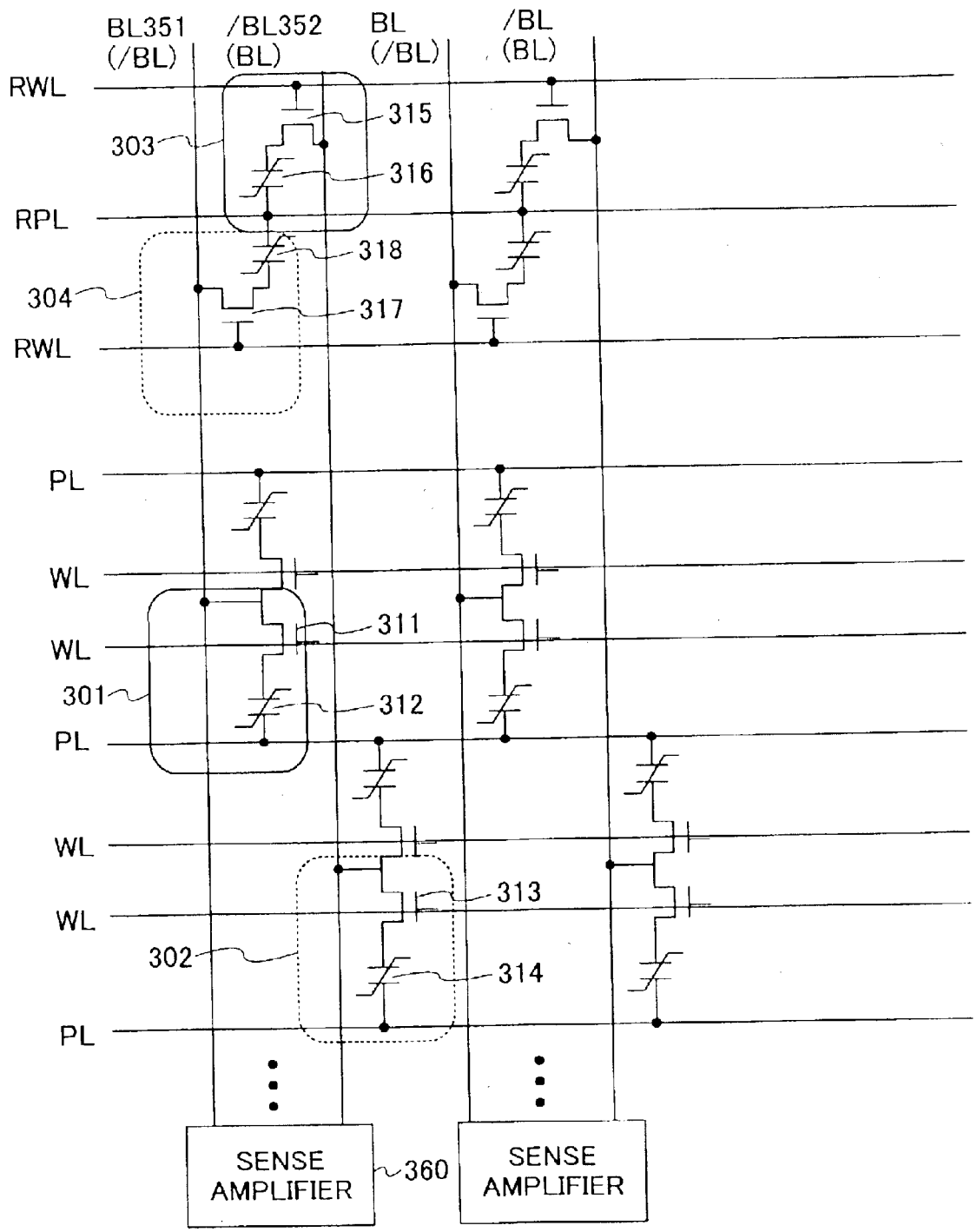
FIG. 1 is a circuit diagram showing a structure of a 1T/1C-type FeRAM.

Hereinafter, embodiments of the present invention will be described with reference to the drawings.
[First Embodiment]
FIG. 1 shows a circuit diagram of the 1T/1C-type FeRAM. In FIG. 1, a memory cell uses one transistor and one capacitor to store 1 bit of information. When information is read out from the memory cell 301 shown in the figure, a transistor 311 within the relevant memory cell 301 is turned ON and the polarization charge of a capacitor 312 within the memory cell 301 appears on the bit line (BL) 351. Furthermore, a transistor 315 within a reference cell 303 corresponding to the memory cell 301 is turned ON and the polarization charge of a capacitor 316 within the reference cell 303 appears on the bit line bar (/BL) 352. Sense amplifier 360 compares the voltages of BL 351 and /BL 352. The sense amplifier 360 then recognizes the information stored in the memory cell 301 as 1 if the voltage of the BL 351 is higher, and as 0 if the voltage of the BL 351 is lower.

The same holds for when information is read out from a memory cell 302. In other words, a transistor 313 within the memory cell 302 is turned ON and the polarization charge of a capacitor 314 within the memory cell 302 appears on the BL 352. Furthermore, a transistor 317 within a reference cell 304 corresponding to the memory cell 302 is turned ON and the polarization charge of a capacitor 318 within the reference cell 304 appears on the bit line (/BL) 351. Sense amplifier 360 compares the voltages of BL 352 and /BL 351. The sense amplifier 360 then recognizes the information stored in the memory cell 302 as 1 if the voltage of the BL 352 is higher, and as 0 if the voltage of the BL 352 is lower.

Figure 2:
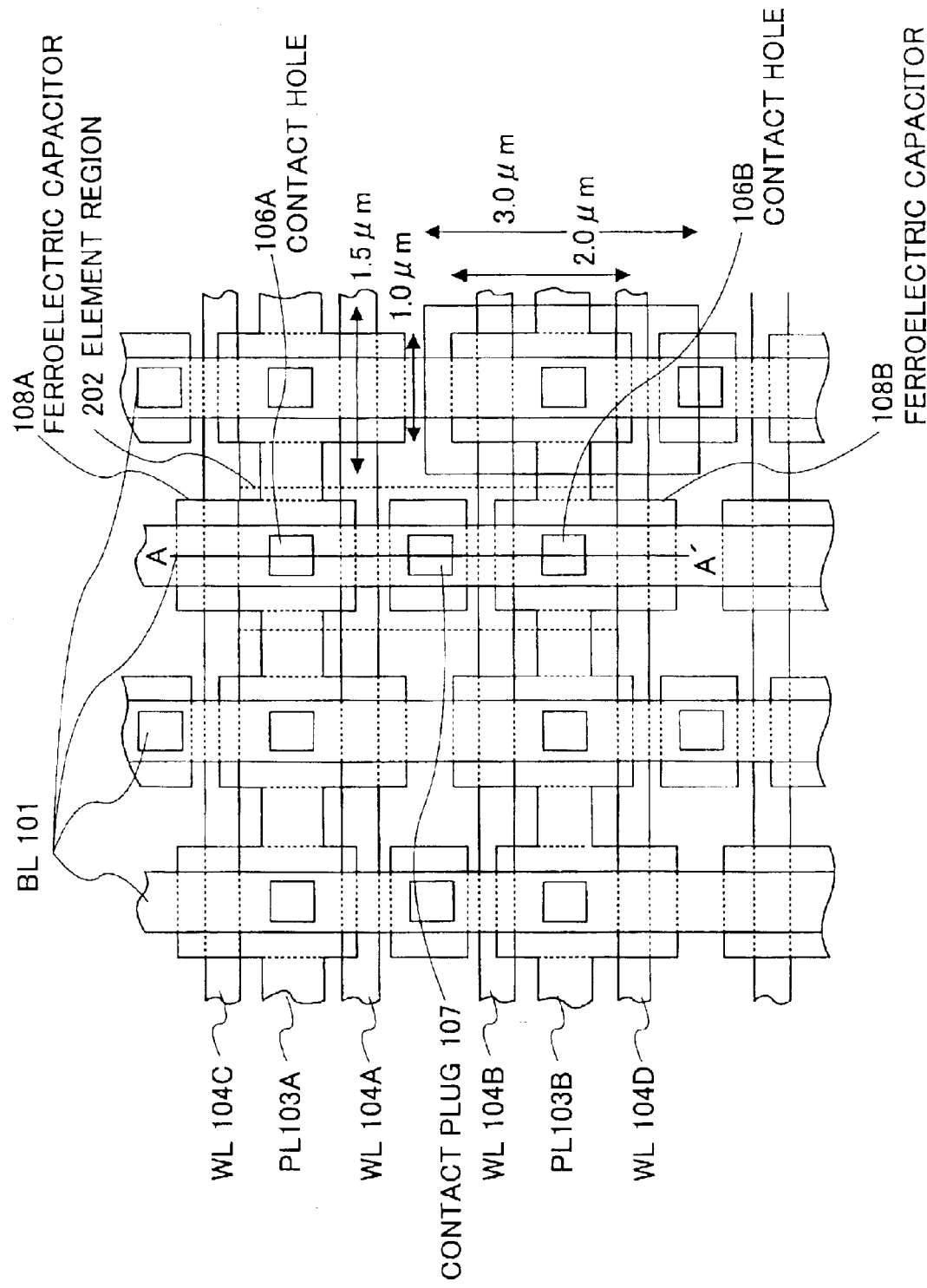
FIG. 2 is a top view showing a stacked FeRAM according to a first embodiment of the present invention.
Figure 3:
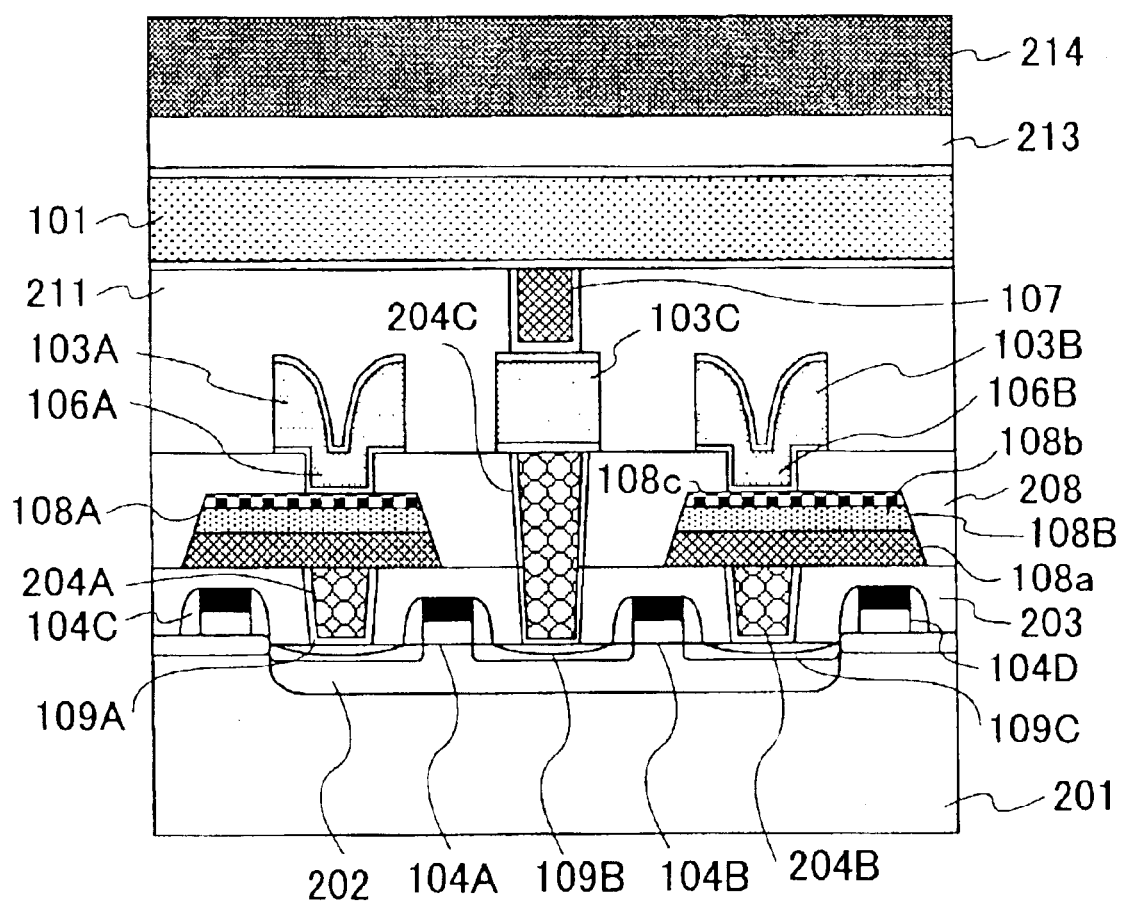
FIG. 3 is a cross-section of the FeRAM shown in FIG. 2.

FIG. 2 is a top view (cell layout) showing a stacked FeRAM according to a first embodiment of the present invention, and FIG. 3 is a cross-section taken along line A–A' of FIG. 2. The stacked FeRAM shown in FIG. 2 and FIG. 3 uses the 1T/1C-type memory cell, where one transistor and one ferroelectric capacitor are used to store 1 bit of information, as shown in FIG. 1.

Referring to FIG. 2 and FIG. 3, the stacked FeRAM is formed on a Si substrate 201 with diffusion well 202 as an element region. In element region 202, the gate electrodes 104A, 104B, 104C, 104D of a polycide structure are formed as word lines (WL) of FeRAM on the surface of the Si substrate 201 via gate insulating film not shown in the figure. In FIG. 2, the gate electrodes 104A, 104B, 104C, and 104D are shown as word lines WL extending parallel to each other.

In Si substrate 201, the diffusion regions 109A, 109B, and 109C are formed on both sides of the respective gate electrodes 104A and 104B, and the gate electrodes 104A, 104B, 104C and 104D are covered with an interlayer insulating film 203.

On the interlayer insulating film 203, ferroelectric capacitors 108A, 108B consisting of a lower electrode 108a, a ferroelectric capacitor insulating film 108b, and an upper electrode 108c are formed in correspondence to the diffusion regions 109A and 109C. The ferroelectric capacitor 108A is connected to the diffusion region 109A via a contact plug 204A formed in the interlayer insulating film 203. Similarly, the ferroelectric capacitor 108B is connected to the diffusion region 109C via a contact plug 204B formed in the interlayer insulating film 203.

The ferroelectric capacitors 108A and 108B are covered with a next interlayer insulating film 208. On the interlayer insulating film 208, the plate lines 103A and 103B are formed in correspondence to the respective ferroelectric capacitors 108A and 108B. The plate line 103A contacts the upper electrode 108c of the ferroelectric capacitor 108A through a contact hole 106A formed in the interlayer insulating film 208. Similarly, the plate line 103B contacts the upper electrode 108c of the ferroelectric capacitor 108B through a contact hole 106B formed in the interlayer insulating film 208.

In the top view shown in FIG. 2, the plate lines 103A and 103B extend parallel to the word lines WL.

Furthermore, on the interlayer insulating film 208, a next interlayer insulating film 211 is formed so as to cover the plate lines 103A and 103B. On the interlayer insulating film 211, a bit line 101 is formed. The bit line 101 contacts the diffusion region 109B via a contact plug 107 formed in the interlayer insulating film 211, an electrode pattern 103C formed on the interlayer insulating film 208, and a contact plug that passes through the interlayer insulating films 208 and 203 and reaches the diffusion region 109B.

In the top view shown in FIG. 2, the bit line 101 forms a bit line BL extending in a direction perpendicular to the word lines WL. The bit line BL corresponds to an array of memory cell transistors and is formed one next to the other along the extending direction of the word lines WL.

Furthermore, on the interlayer insulating film 211, an oxide film 213 is formed so as to cover the bit line 101, and on the oxide film 213, a passivation film 214 consisting of nitride film is formed.

In the embodiment shown in FIG. 2 and FIG. 3, the word lines WL and the plate lines PL extend linearly parallel to each other. The bit line BL linearly extends in a direction perpendicular to the word lines WL.

In the top view shown in FIG. 2, the contact holes 106A and 106B are in line with each other on the plate lines PL.

In the FeRAM having a cross-section shown in FIG. 3, i.e., the FeRAM having a CUB structure, the ferroelectric capacitors 108A and 108B are formed below the plate lines 103A and 103B, and hence below the bit line 101. Thus the plate lines 103A and 103B, or the bit line 101 is formed after the ferroelectric capacitors 108A and 108B are formed. Therefore, the conductor pattern forming these electrodes is not subjected to heat treatment in an oxidation atmosphere for crystallization or for oxygen loss compensation of the ferroelectric capacitor insulating film 108$b$, and thus a problem regarding oxidation or melting of the bit line pattern will not arise.

[Second Embodiment]

Figure 4:
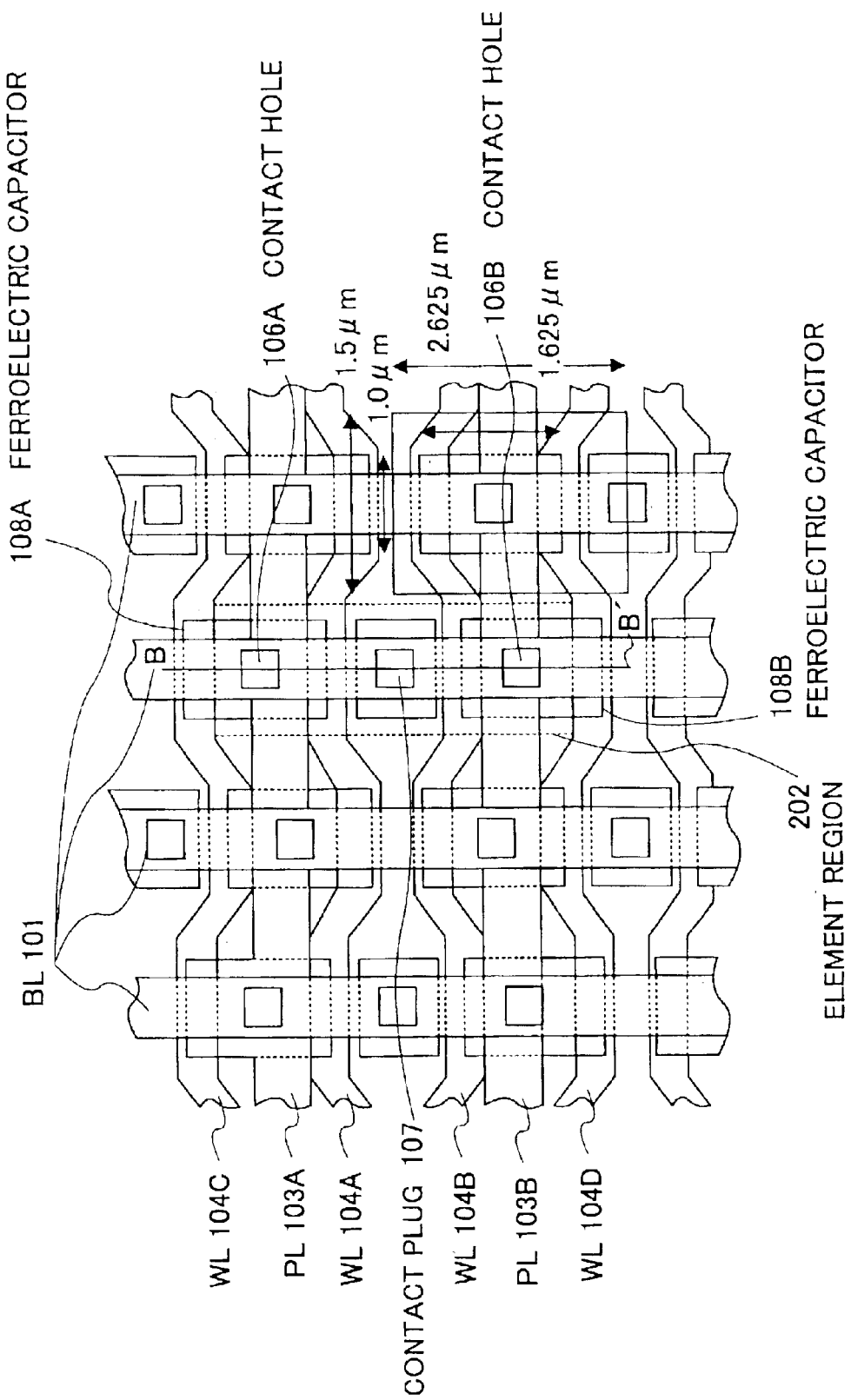
FIG. 4 is a top view showing a stacked FeRAM according to a second embodiment of the present invention.
Figure 5:
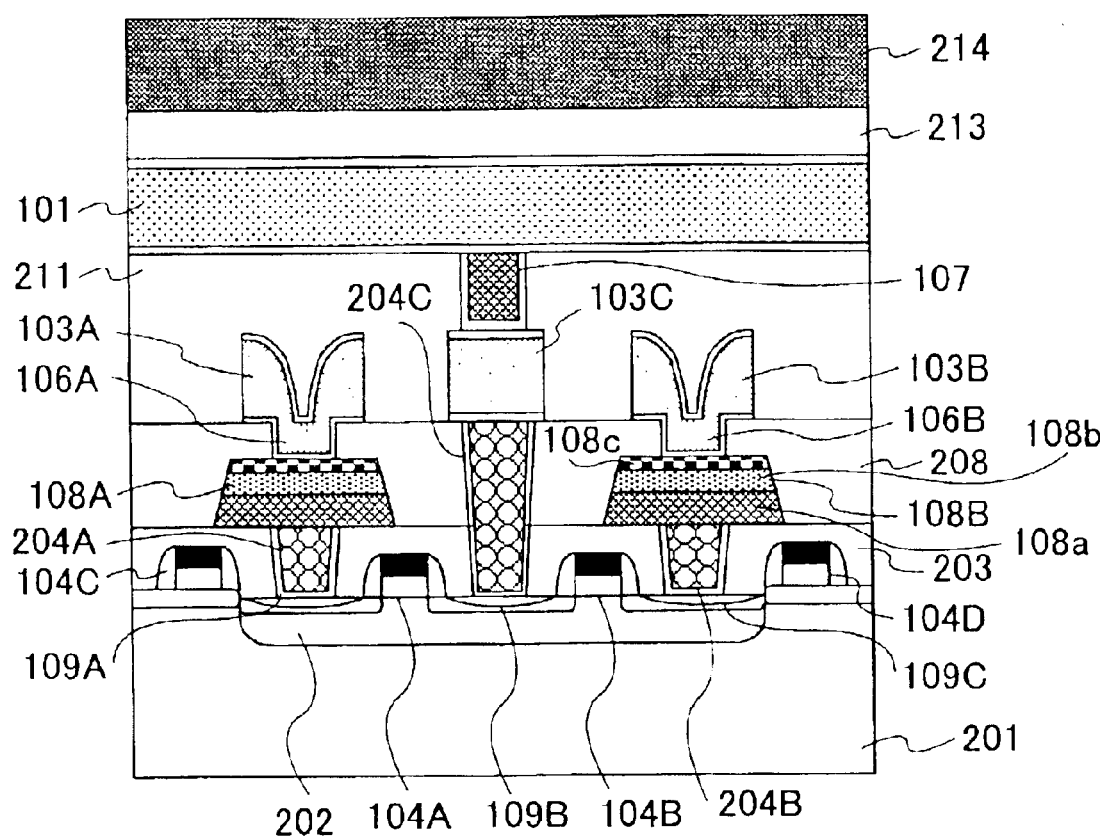
FIG. 5 is a cross-section of the FeRAM shown in FIG. 4.

FIG. 4 is a top view (cell layout) showing a stacked FeRAM according to a second embodiment of the present invention, and FIG. 5 is a cross section taken along line B–B' of FIG. 4. The stacked FeRAM shown in FIG. 4 and FIG. 5 uses a 1T/1C-type memory cell, where one memory cell transistor and one ferroelectric capacitor are used to store 1 bit of information as shown in FIG. 1.

The stacked FeRAM has substantially the same structure as the stacked FeRAM in FIG. 2 and FIG. 3 but different in the following aspects.

In the stacked FeRAM in FIG. 4, the word lines WL are bent so as to avoid the contact plug 107, in other words in a meander. To be more precise, in areas near the contact plug 107, the word line WL moves away from the opposing other word line WL with the contact plug 107 in between. On the other hand, in other areas not near the contact plug 107, the word line WL is bent toward the other word line. The word line WL, when bent away from or toward the other word line WL, is bent 45° with respect to its longitudinal direction. Furthermore, in the stacked FeRAM in FIG. 4, contact holes 106A and 106B deviate in the left and right direction from the centerline of the plate line PL, respectively. Since the word lines WL are bent, the position of the ferroelectric capacitors 108A and 108B shift alternately along the extending direction of the word lines WL.

Here, comparing the stacked FeRAM in FIG. 2 and the stacked FeRAM in FIG. 4, if the stacked FeRAM in FIG. 2 is designed by the CMOS rule of 0.35 $\mu$m, the size of the memory cell for storing 1 bit of information will be 1.5 $\mu$m×3.0 $\mu$m, and the size of the ferroelectric capacitor 108 will be 1.0 $\mu$m×2.0 $\mu$m. On the other hand, if the stacked FeRAM in FIG. 4 is designed by the CMOS rule of 0.35 $\mu$m, the size of the memory cell for storing 1 bit of information will be 1.5 $\mu$m×2.625 $\mu$m, and the size of the ferroelectric capacitor 108 will be 1.0 $\mu$m×1.625 $\mu$m.

Therefore, the stacked FeRAM in FIG. 4 reduces the size of the memory cell and higher integration density is achieved compared to the stacked FeRAM in FIG. 2. On the other hand, the stacked FeRAM in FIG. 2 is more advantageous than the stacked FeRAM in FIG. 4 when the sizes of the ferroelectric capacitor 108A and 108B are increased and their capacitance is increased.

[Third Embodiment]

Figure 6:
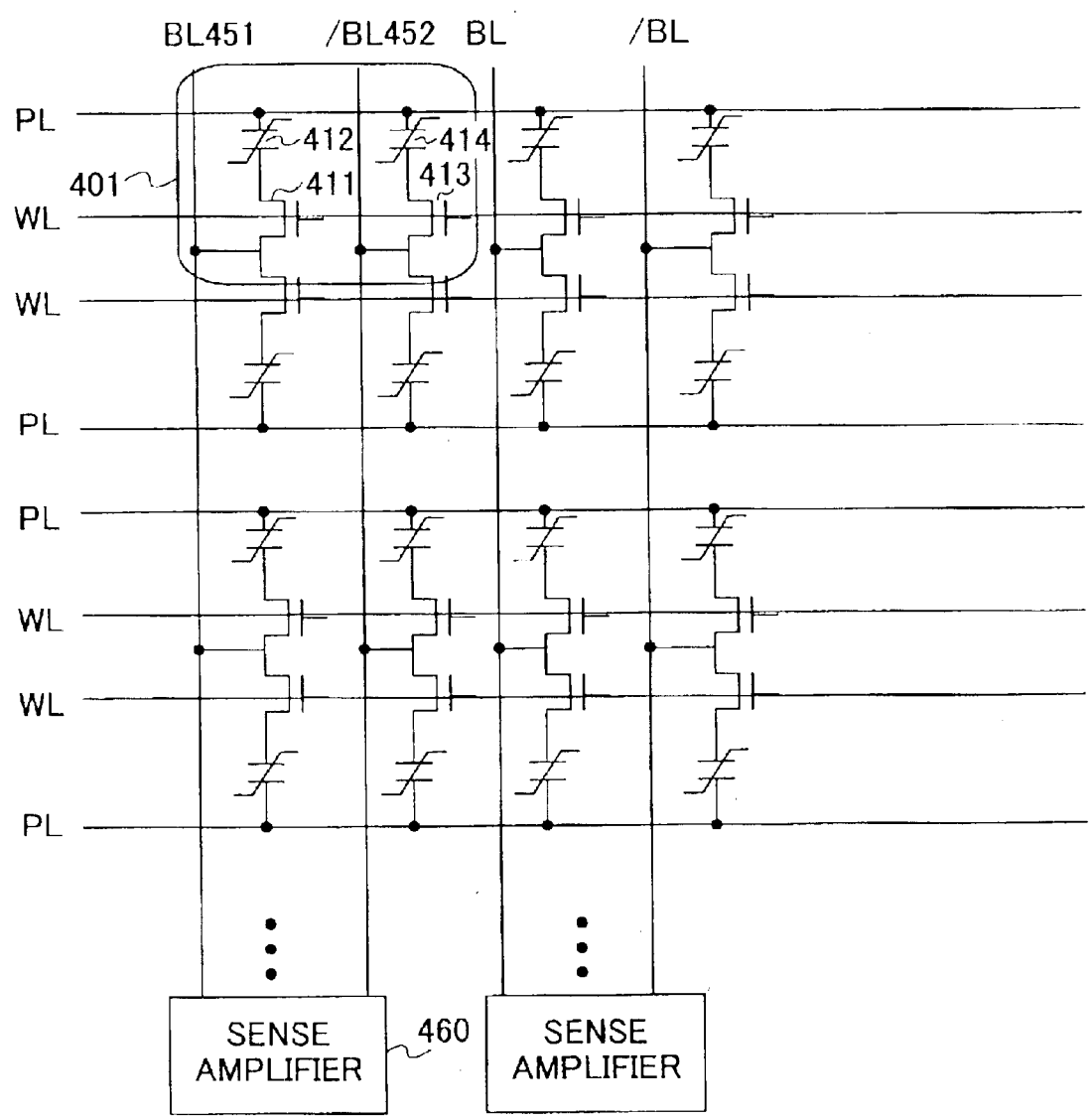
FIG. 6 is a circuit diagram of a 2T/2C-type FeRAM.

FIG. 6 shows a circuit diagram of the 2T/2C-type FeRAM. In FIG. 6, the memory cell uses two transistors and two capacitors to store 1 bit of information. In a memory cell 401 shown in this figure, when a capacitor 412 stores information of "1", a capacitor 414 performs a complementary operation and stores the opposite information of "0".

When information is read out from the memory cell 401, a transistor 411 within the relevant memory cell 401 is turned ON, and the polarization charge of the capacitor 412 within the memory cell 401 appears on the bit line (BL) 451. Furthermore, a transistor 413 within the memory cell 401 is turned ON, and the polarization charge of the capacitor 414 within the memory cell 401 appears on the bit line (/BL) 452. Sense amplifier 460 compares the voltages of BL 451 and /BL 452. The sense amplifier 460 recognizes the information stored in the memory cell as 1 if the voltage of the BL 451 is higher, and as 0 if the voltage of the BL 451 is lower.

Figure 7:
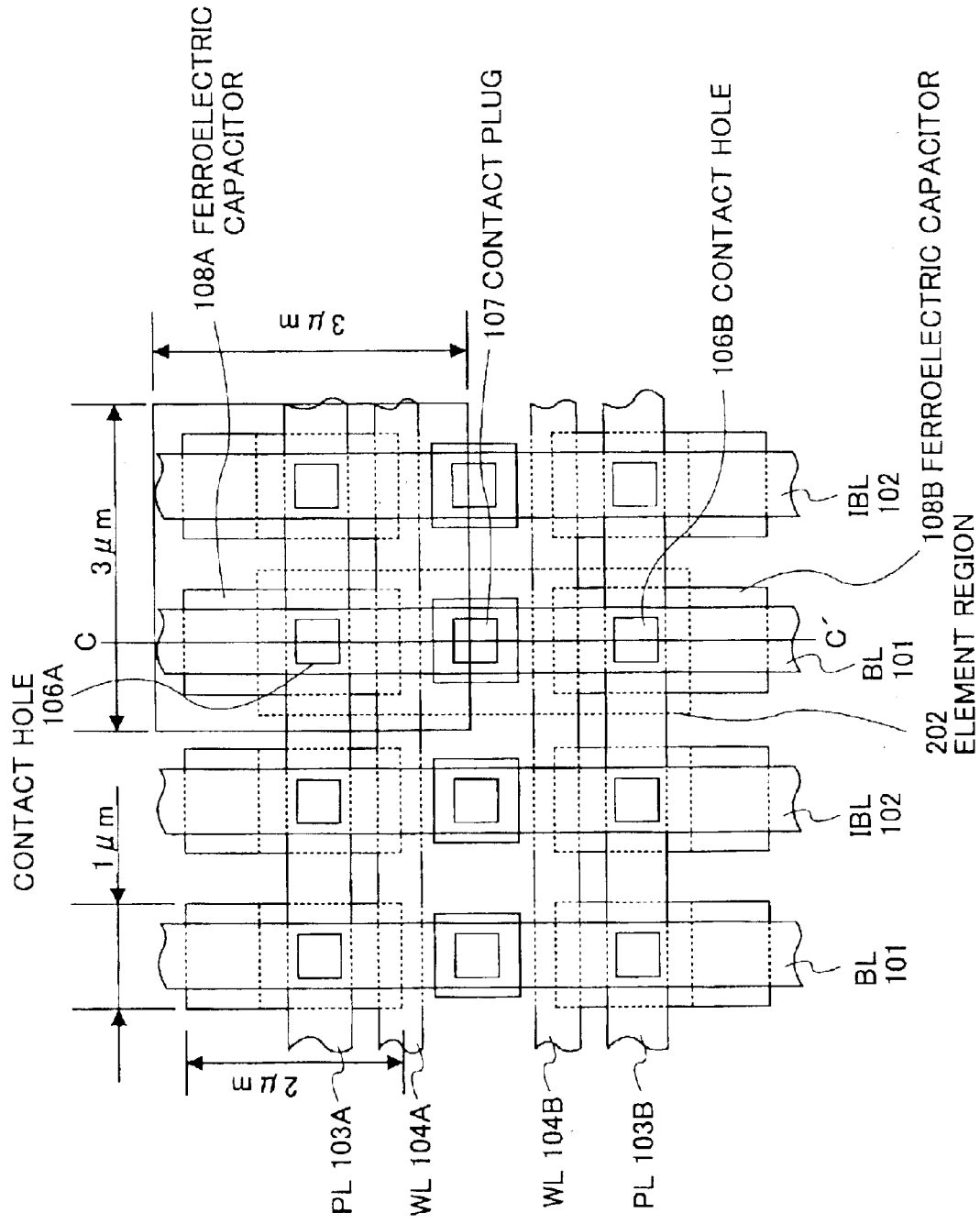
FIG. 7 is a top view of a stacked FeRAM according to a third embodiment of the present invention.
Figure 8:
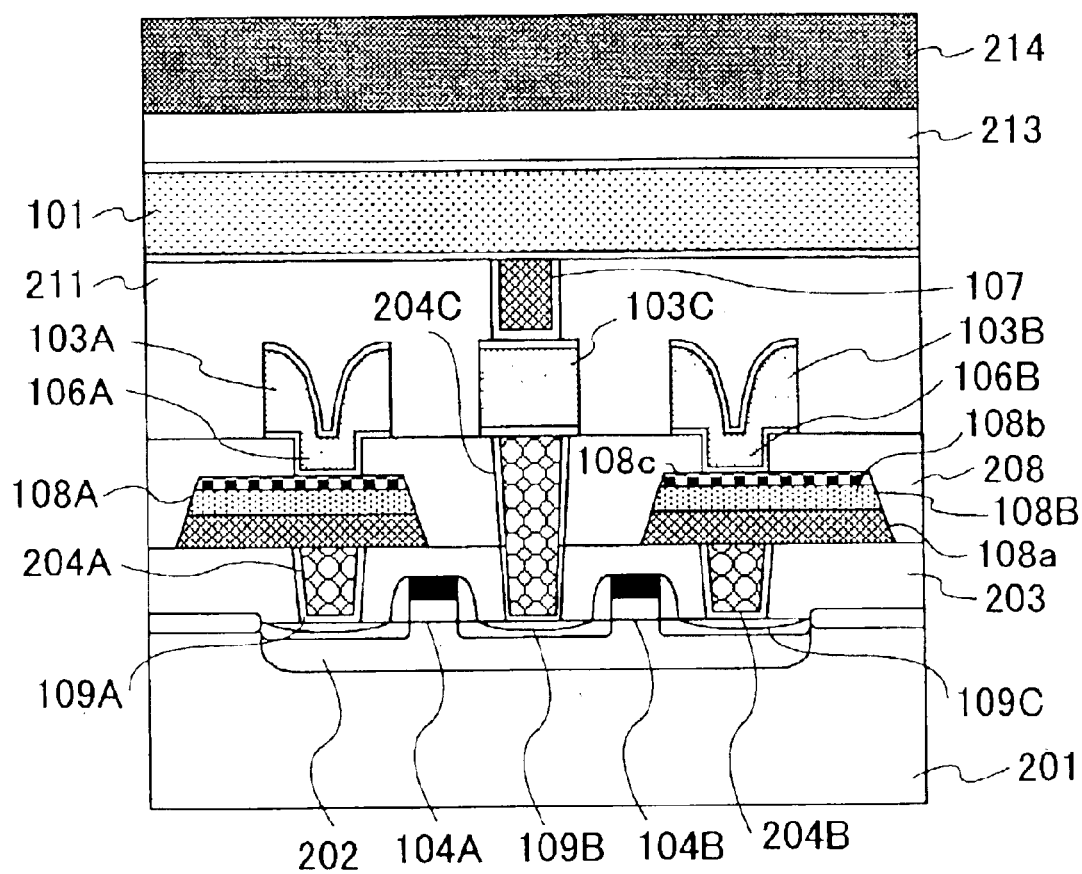
FIG. 8 is a cross-section of the FeRAM shown in FIG. 7.

FIG. 7 is a top view (cell layout) of a stacked FeRAM according to the third embodiment of the present invention, and FIG. 8 is a cross-section taken along line C–C' of FIG. 7. The stacked FeRAM shown in FIG. 7 and FIG. 8 uses the 2T/2C-type memory cell, where two transistors and two ferroelectric capacitors are used to store 1 bit of information.

The stacked FeRAM has substantially the same cross-section as that of the stacked FeRAM shown in FIGS. 2 and 3, and word lines WL are formed on a memory cell transistor made from a CMOS process. Furthermore, the ferroelectric capacitor 108A is formed immediately above the contact plug 204A connected to the diffusion region 109A. The upper electrode 108C of the ferroelectric capacitor 108A is fabricated by full field etching. Similarly, the ferroelectric capacitor 108B is formed immediately above the contact plug 204B connected to the diffusion region 109C. The upper electrode 108C of the ferroelectric capacitor 108B is fabricated by full field etching. In other words, these ferroelectric capacitors 108A and 108B are planar stack ferroelectric capacitor structures. Furthermore, the upper electrodes 108$c$ of the ferroelectric capacitors 108A and 108B are covered by interlayer insulating film 208. The upper electrodes 108$c$ and the plate lines 103A and 103B or the first layer wiring are connected through contact holes 106A and 106B formed in the interlayer insulating film 208.

Furthermore, the contact plug 107 is formed on the diffusion region 109B, and via this contact plug 107, the bit line 101 formed above the ferroelectric capacitors 108A and 108B and the diffusion region 109B are connected. Therefore, this stacked FeRAM has a different structure from the COB structure in which ferroelectric capacitor is formed above the bit line as in a normal DRAM.

If the stacked FeRAM in FIG. 4 is designed by the CMOS rule of 0.35 $\mu$m, the size of the memory cell for storing 1 bit of information will be 3.0 $\mu$m×3.0 $\mu$m and the size of the ferroelectric capacitor 108 will be 1.0 $\mu$m×2.0 $\mu$m.

[Fourth Embodiment]

Next, manufacturing steps of the stacked FeRAM of the present invention are explained. It is noted that FIG. 9A through FIG. 9C show the first step through the third step, FIG. 9D through FIG. 9F show the fourth step through the sixth step, FIG. 9G and FIG. 9H show the seventh step and the eighth step, and FIG. 9I and FIG. 9J show the ninth step and the tenth step of the manufacturing steps for the stacked FeRAM.

Figure 9A:
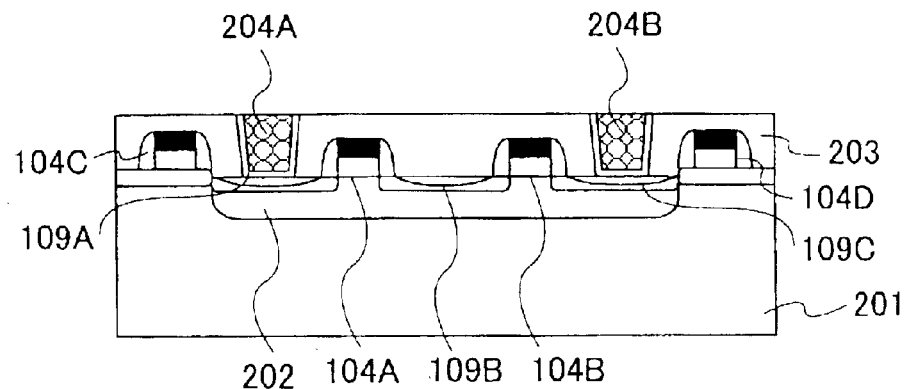
FIGS. 9A–9J are diagrams showing steps for manufacturing the stacked FeRAM of the present invention.

In the first step shown in FIG. 9A, an element region 202 is formed in a substrate 201 through the CMOS process, and gate electrodes 104A, 104B, 104C, 104D forming the word lines WL are formed on the upper part of the element region 202. Next, an interlayer insulating film 203 is formed on the upper surface of the substrate 201 provided with the element region 202. The interlayer insulating film 203 formed on the upper surface of the diffusion regions 109A and 109C of the element region 202 is then removed, and tungsten is deposited, forming contact plugs 204A and 204B for connecting the diffusion regions 109A and 109C and the ferroelectric capacitors 108A and 108B, as will be explained below. Furthermore, the upper surface of the interlayer insulating film 203 and the contact plugs 204A and 204B are grounded by the CMP (Chemical and Mechanical Polishing) method.

Figure 9B:
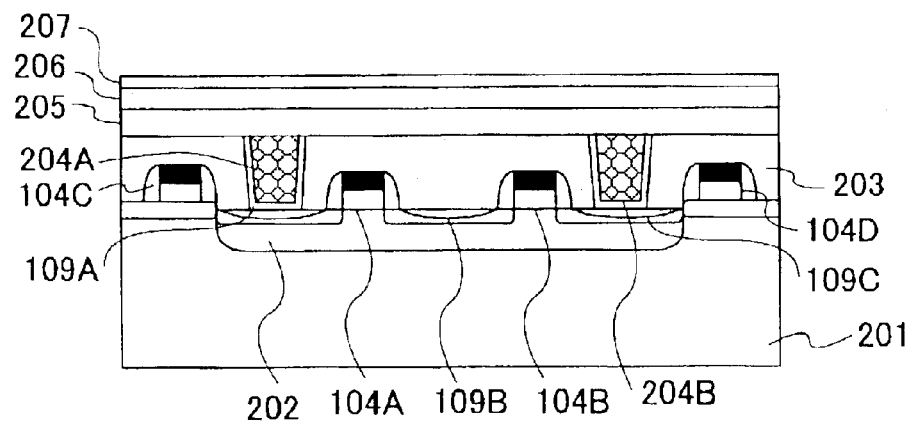

In the second step shown in FIG. 9B, a lower electrode 205, a ferroelectric film 206, and an upper electrode 207 are formed on the upper surface of the grounded interlayer film 203 and the contact plugs 204A and 204B. Here, the lower electrode 205 is made by sequentially depositing from the bottom layer 200 nm thick Ir, 300 nm thick IrOx, 20 nm thick Ti, and 50 nm thick Pt. Furthermore, the ferroelectric film 206 is made from 200 nm thick PZT and the upper electrode 207 is made from 200 nm thick IrOx.

Figure 9C:
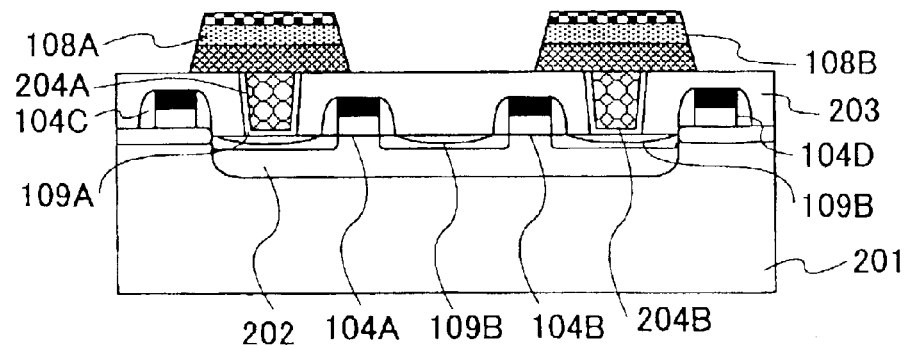
Figure 9D:
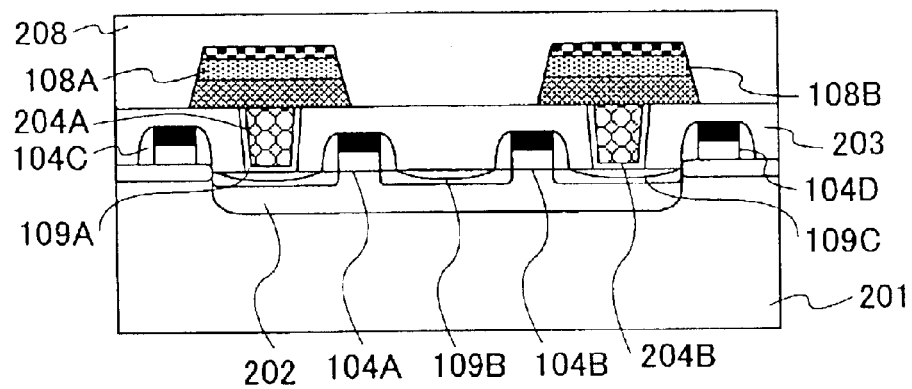
Figure 9E:
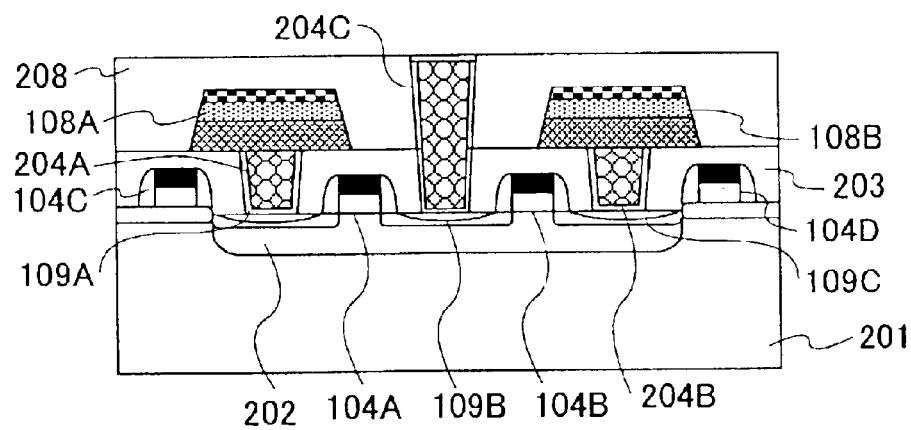
Figure 9F:
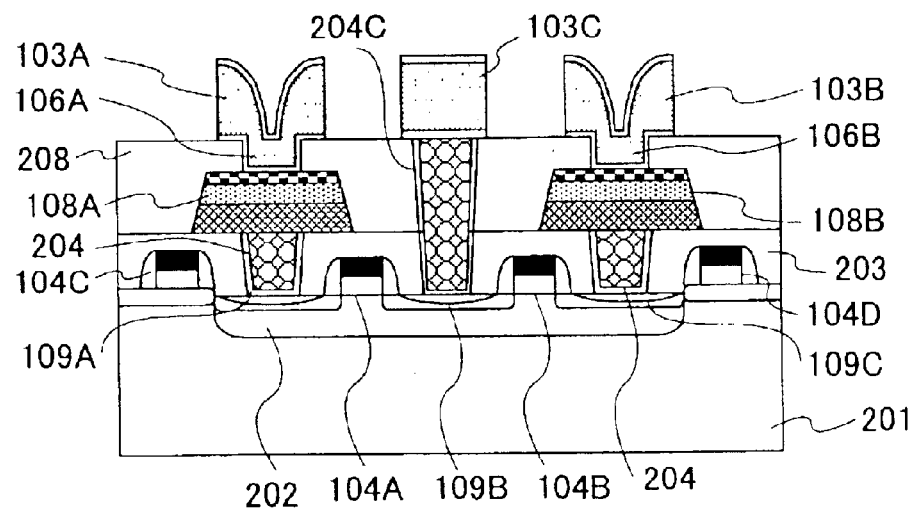
Figure 9G:
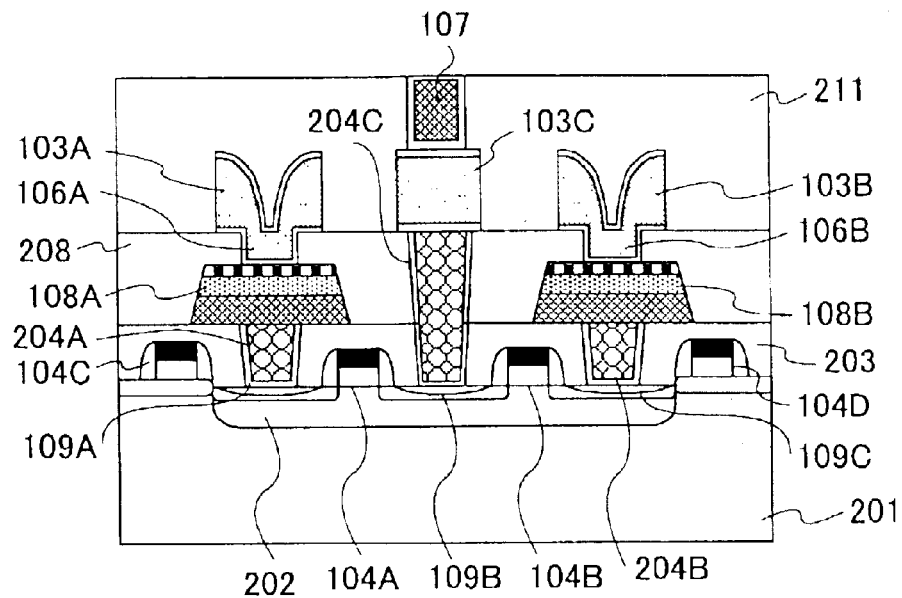
Figure 9H:
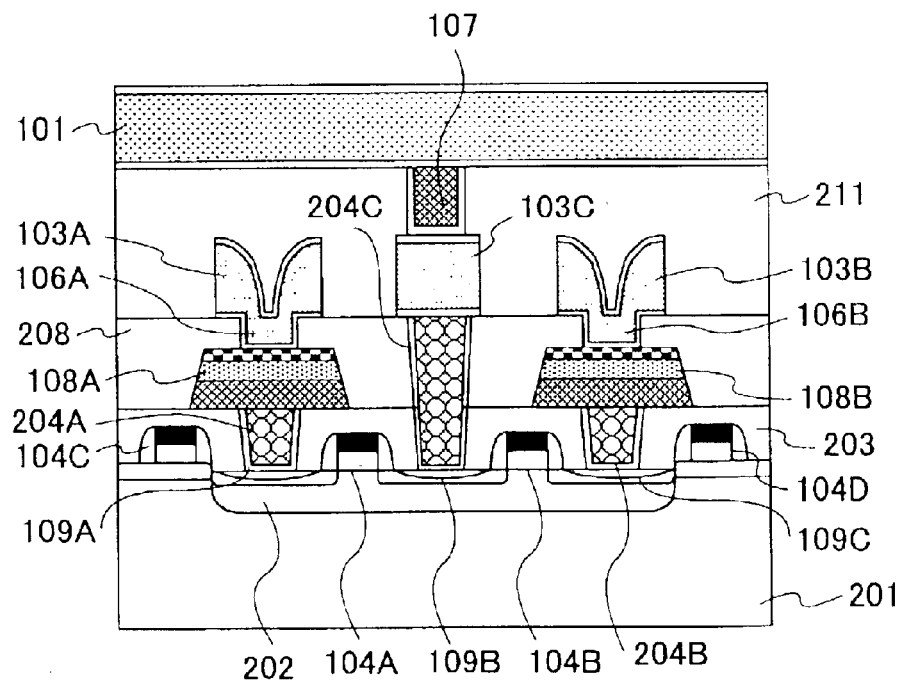
Figure 9I:
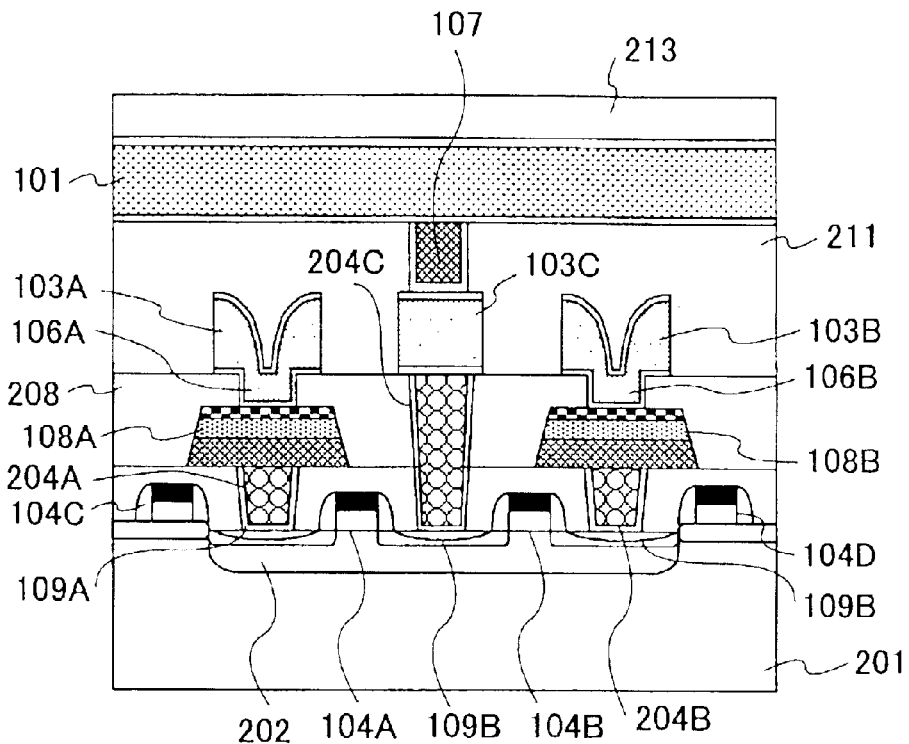
Figure 9J:
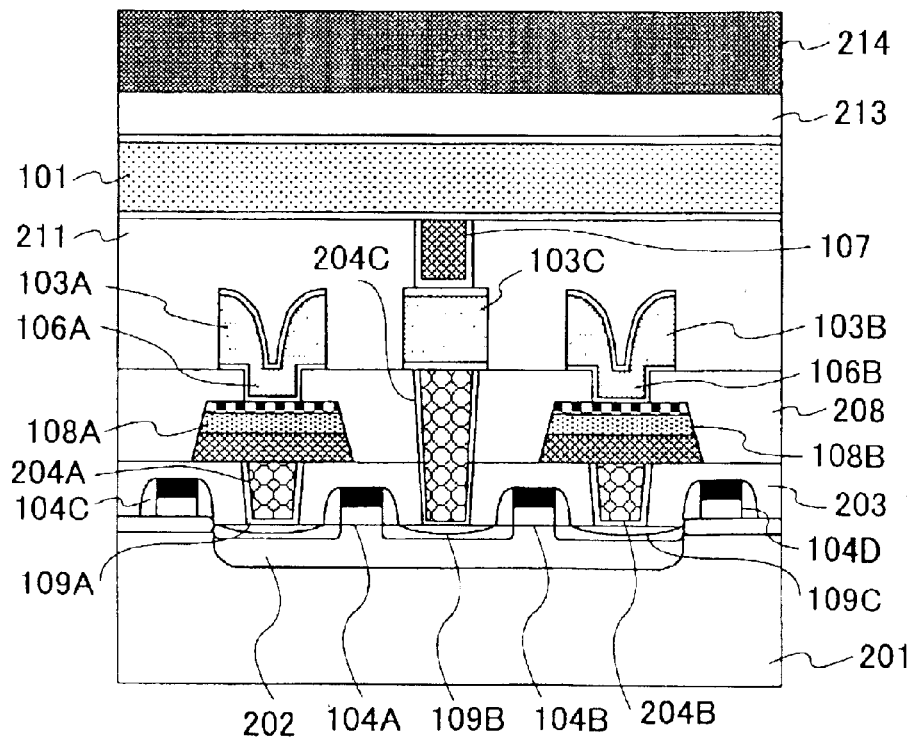

In the third step shown in FIG. 9C, the ferroelectric capacitors 108A and 108B are formed by means of patterning and etching techniques, leaving the lower electrode 205, the ferroelectric film 206, and the upper electrode 207 on the contact plugs 204A and 204B.

In the fourth step shown in FIG. 9D, an interlayer insulating film 208 is deposited on an exposed surface of the interlayer insulating film 203 and the ferroelectric capacitors 108A and 108B by the CVD (Chemical Vapor Deposition) method. The upper surface of the deposited interlayer insulating film 208 is then ground by the CMP method.

In the fifth step shown in FIG. 9E, part of the interlayer insulating film 203 and the interlayer insulating film 208 are removed, and the contact hole for contacting the diffusion region 109B of the element region 202 is formed. Then, W is deposited to this contact hole by the CVD method. Contact plug 204C is formed by grinding the upper surface of the deposited W by the CMP method.

In the sixth step shown in FIG. 9F, the interlayer insulating film 208 deposited on the upper part of the ferroelectric capacitors 108A and 108B is removed and the contact holes 106A and 106B are formed. A first metal layer of Al is connected to the upper electrode of the ferroelectric capacitors 108A and 108B exposed at the bottom surface of these contact holes 106A and 106B, and plate lines 103A and 103B are formed by patterning. Further, the first metal layer of Al is connected to the contact plug 204C and an electrode pattern 103C is formed by patterning.

In the seventh step shown in FIG. 9G, the interlayer insulating film 211 is deposited so as to cover the plate lines 103A and 103B as well as the electrode pattern 103C by the CVD method. The upper surface of this interlayer insulating film 211 is ground by the CMP method. Next, the interlayer insulating film 211 on the electrode pattern 103C is removed and the contact hole is formed. Then, W is deposited to the contact hole by the CVD method and the contact plug 107 is formed by grinding the upper surface by the CMP method.

In the eighth step shown in FIG. 9H, a second metal layer of Al is grown on the upper surface of the contact plug 107 and the interlayer insulating film 211, and the bit line 101 is formed through patterning. Thus, the bit line 101 and the element region 202 are electrically connected.

In the ninth step shown in FIG. 9I, an oxide film 213 is formed on the upper surface of the bit line 101 and the interlayer insulating film 211 by the CVD method. In the tenth step further shown in FIG. 9J, the passivation film 214 is formed on the upper surface of the oxide film 213 through the CVD method.

The stacked FeRAM of the present embodiment makes it easy to form the bit line 101 flatly even when CUB structure, i.e., a structure in which bit line 101 is formed above the ferroelectric capacitor 108, is used because there is no need to increase the size of the ferroelectric capacitor nor to increase its capacitance as much as the DRAM. Furthermore, as the bit line 101 is formed after the ferroelectric capacitor 108, there is no need to prevent oxidation or melting of the bit line 101 during heat treatment for suppressing the oxygen loss of the ferroelectric film. Thus, manufacturing is facilitated.

Similar to the stacked FeRAM in FIG. 4 and FIG. 5, when the word line 104 is formed so that it is bent away from an opposing other word line 104 with the contact plug 107 in between in areas near the contact plug 107, and toward the other word line 104 in other areas not near the contact plug 107, by making the word line linear and bending it away from the other word line 104 even when not near the contact plug 107, the size of the memory cell is reduced and higher Integration density is achieved than when a gap exists with the other word line 104.

While the preferred form of the present invention has been described, it is to be understood that the present invention is not limited to these embodiments, and variations and modifications may be made without departing from the scope of the present invention.

For example, in the above embodiments, the lower electrode 205 is a stacked layer structure of Ir, IrOx, Ti, and Pt, but it can also be made solely from Ir, or as a stacked layer structure of Pt and Ti. Furthermore, in the above embodiments, PZT is used as the material of ferroelectric film 206, but PLZT, SBT, SBTN and other materials may also be used.

According to the present invention as stated above, by forming the word line so that it is bent away from the opposing other word line with a second contact plug in between in areas near the second contact plug, and toward the other word line in other areas, and by forming the contact hole connecting the plate line and the upper electrode of the ferroelectric capacitor so that the contact holes are displaced alternately from the longitudinal centerline of the plate line, the size of the memory cell is reduced and higher integration density is achieved compared to when the word line is bent away from the other word line in areas not near the second contact plug and the contact hole is formed on the centerline of the plate line.

Furthermore, according to the present invention, even if the CUB structure in which the bit line is formed above the ferroelectric capacitor is used, the bit line can be readily formed flatly. Furthermore, since the bit line is formed after the ferroelectric capacitor, there is no need to prevent oxidation and melting of the bit line during heat treatment for suppressing oxygen loss of the ferroelectric film. The manufacturing can thus be facilitated.

What is claimed is:

1. A semiconductor device comprising:

a substrate;

a plurality of memory cell transistors formed on said substrate and arranged in arrays in a first direction and in a second direction different from the first direction, and each of the memory cell transistor being provided with a first and a second diffusion region;

a ferroelectric capacitor connected to said first diffusion region in each of said memory cell transistors via a first contact plug;

a plurality of bit lines formed above said ferroelectric capacitor, and connected to said second diffusion regions of said memory cell transistors arranged in said first direction via a second contact plug, each bit line being extended in said first direction and arranged next to each other in said second direction;

a plurality of word lines formed between said first and second contact plugs of each memory cell transistor, each word line being extended in said second direction and arranged next to each other in said first direction; and a plurality of plate lines each being extended in said second direction and arranged next to each other in said first direction, the plate lines being connected to upper electrodes of a group of the ferroelectric capacitors arranged in said second direction through a plurality of contact holes;

wherein
  each of said word lines is bent away from an opposing other word line in areas near said second contact plug, and toward said other word line in other areas; and
  said plurality of contact holes is displaced alternately with respect to a longitudinal centerline of said plate line.

2. The semiconductor device as claimed in claim 1, wherein each of said word lines extends in an oblique direction with respect to said second direction in areas near said second contact plugs.

3. The semiconductor device as claimed in claim 1, wherein said diffusion region of said memory cell transistor is rectangular.

4. The semiconductor device as claimed in claim 1, wherein said device is a 2T/2C-type in which two of the memory cell transistors and two of the ferroelectric capacitors are used to store 1 bit of information.

5. The semiconductor device as claimed in claim 1, wherein said device is a 1T/1C-type in which one of the memory cell transistors and one of the ferroelectric capacitors are used to store 1 bit of information.

6. A semiconductor device comprising:
  a substrate;
  a memory cell transistor formed on said substrate and provided with a first and a second diffusion region;
  a ferroelectric capacitor connected to said first diffusion region in said memory cell transistor via a first contact plug;
  a bit line formed above said ferroelectric capacitor, and connected to said second diffusion region via a second contact plug;
  a word line formed between said first and said second contact plug; and
  a plurality of plate lines connected to upper electrodes of said ferroelectric capacitors through contact holes; wherein
    said plate line comprises projecting portions on one side of its longitudinal direction; and
    said contact bole being formed on said projecting portions.

7. A semiconductor device comprising:
  a substrate;
  a memory cell transistor array formed on said substrate;
  a ferroelectric capacitor provided in each of said memory cell transistors;
  a word line being extended as a gate electrode in a group of said memory cell transistor arranged in a first direction;
  a plate line being extended in said first direction and connected to said group of said memory cell transistors arranged in said first direction through each of a plurality of contact holes; and
  a bit line being extended in a second direction and connected to a group of said ferroelectric capacitors arranged in said second direction via each of a plurality of contact plugs; wherein
    said word line being bent with respect to said first direction so as to be bent away from an opposing other word line in areas near said contact plug, and toward said other word line in other areas;
    said plate line comprising a plurality of projecting portions displaced alternately with respect to said first direction;
    said projecting portion projecting in a bent direction of said word line;
    each of said contact hole being formed on said projecting portion.

8. A method of manufacturing a semiconductor device comprising the steps of:
  forming a memory cell transistor on a substrate;
  performing heat treatment on a ferroelectric film of a ferro electric capacitor;
  forming a contact plug connected to said memory cell transistor after said step of performing heat treatment;
  forming a bit line connected to said memory cell transistor via said contact plug somewhere above said ferroelectric capacitor;
  forming a word line adjacent to said contact plug and so as to bent away from an opposing other word line in areas near said contact plug, and toward said other word line in other areas;
  forming a plate line; and
  forming a contact hole for connecting an upper electrode of said ferroelectric capacitor and said plate line at a position deviating from a longitudinal centerline of said plate line.

* * * * *